US009722074B2

(12) United States Patent
Koval et al.

(10) Patent No.: US 9,722,074 B2
(45) Date of Patent: Aug. 1, 2017

(54) LOCAL BURIED CHANNEL DIELECTRIC FOR VERTICAL NAND PERFORMANCE ENHANCEMENT AND VERTICAL SCALING

(71) Applicant: Intel Corporation, Santa Clara, CA (US)

(72) Inventors: Randy J. Koval, Boise, ID (US); Fatma A. Simsek-Ege, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/884,210

(22) Filed: Oct. 15, 2015

(65) Prior Publication Data

US 2016/0190313 A1     Jun. 30, 2016

Related U.S. Application Data

(63) Continuation of application No. 13/832,721, filed on Mar. 15, 2013, now Pat. No. 9,190,490.

(51) Int. Cl.
*H01L 29/78*     (2006.01)
*H01L 29/66*     (2006.01)
(Continued)

(52) U.S. Cl.
CPC ...... *H01L 29/7827* (2013.01); *H01L 27/1157* (2013.01); *H01L 27/11524* (2013.01);
(Continued)

(58) Field of Classification Search
CPC ........... H01L 29/7827; H01L 27/11524; H01L 27/11556; H01L 27/1157
(Continued)

(56) References Cited

U.S. PATENT DOCUMENTS

2010/0109065 A1    5/2010   Oh et al.
2010/0213537 A1    8/2010   Fukuzumi et al.
(Continued)

FOREIGN PATENT DOCUMENTS

JP    2012-248644 A    12/2012
JP    2012195424    3/2014
(Continued)

OTHER PUBLICATIONS

Jaehoon Jang, et al., "Vertical Cell Array using TCAT (Terabit Cell Array Transistor) Technology for Ultra High Density NAND Flash Memory", Symposium on VLSI Technology Digest of Technical Papers, 2009, 2 pages.
(Continued)

*Primary Examiner* — Errol Fernandes
(74) *Attorney, Agent, or Firm* — Compass IP Law PC

(57) ABSTRACT

A non-volatile memory device and a method for forming the non-volatile memory device are disclosed. The memory device utilizes a local buried channel dielectric in a NAND string that reduces bulk channel leakage at the edge of the NAND string where the electric field gradient along the direction of the string pillar is at or near a maximum during programming operations. The memory device comprises a channel that is coupled at one end to a bitline and at the other end to a source. A select gate is formed at the end of the channel coupled to the bitline to selectively control conduction between the bitline and the channel. At least one non-volatile memory cell is formed along the length of the channel between the select gate and the second end of the channel. A local dielectric region is formed within the channel at the first end of the channel.

20 Claims, 27 Drawing Sheets

(51) Int. Cl.
  *H01L 29/788* (2006.01)
  *H01L 29/792* (2006.01)
  *H01L 27/11556* (2017.01)
  *H01L 27/11582* (2017.01)
  *H01L 27/11524* (2017.01)
  *H01L 27/1157* (2017.01)

(52) U.S. Cl.
  CPC .. *H01L 27/11556* (2013.01); *H01L 27/11582* (2013.01); *H01L 29/66666* (2013.01); *H01L 29/7889* (2013.01); *H01L 29/7926* (2013.01)

(58) Field of Classification Search
  USPC .......................... 257/314, 315, 324; 438/257
  See application file for complete search history.

(56) References Cited

U.S. PATENT DOCUMENTS

| | | | |
|---|---|---|---|
| 2011/0227140 A1 | 9/2011 | Ishiduki et al. | |
| 2012/0069661 A1 | 3/2012 | Iwai | |
| 2012/0098048 A1* | 4/2012 | Choe | H01L 29/7926 257/324 |
| 2012/0104484 A1 | 5/2012 | Lee et al. | |
| 2012/0235221 A1 | 9/2012 | Ishiduki et al. | |
| 2012/0248399 A1 | 10/2012 | Sasago et al. | |
| 2012/0299076 A1 | 11/2012 | Yoo et al. | |
| 2013/0032878 A1 | 2/2013 | Kim et al. | |

FOREIGN PATENT DOCUMENTS

| | | |
|---|---|---|
| JP | 201215517 | 8/2015 |
| WO | 2012003301 A2 | 1/2012 |

OTHER PUBLICATIONS

International Search Report and Written Opinion received for PCT Patent Application No. PCT/US2014/016290, mailed on May 30, 2014, 14 pages.
Korean Intellectual Property Office Notice of Preliminary Rejection, Mailed Jul. 15, 2016, 6 pages.
English Translation of the Notice of Reasons for Rejection, Application No. 2016-500252, Mailed Nov. 1, 2016, 4 pages.
Extended European Search Report for Patent Application No. 14769456.6, Mailed Oct. 14, 2016, 8 pages.

* cited by examiner

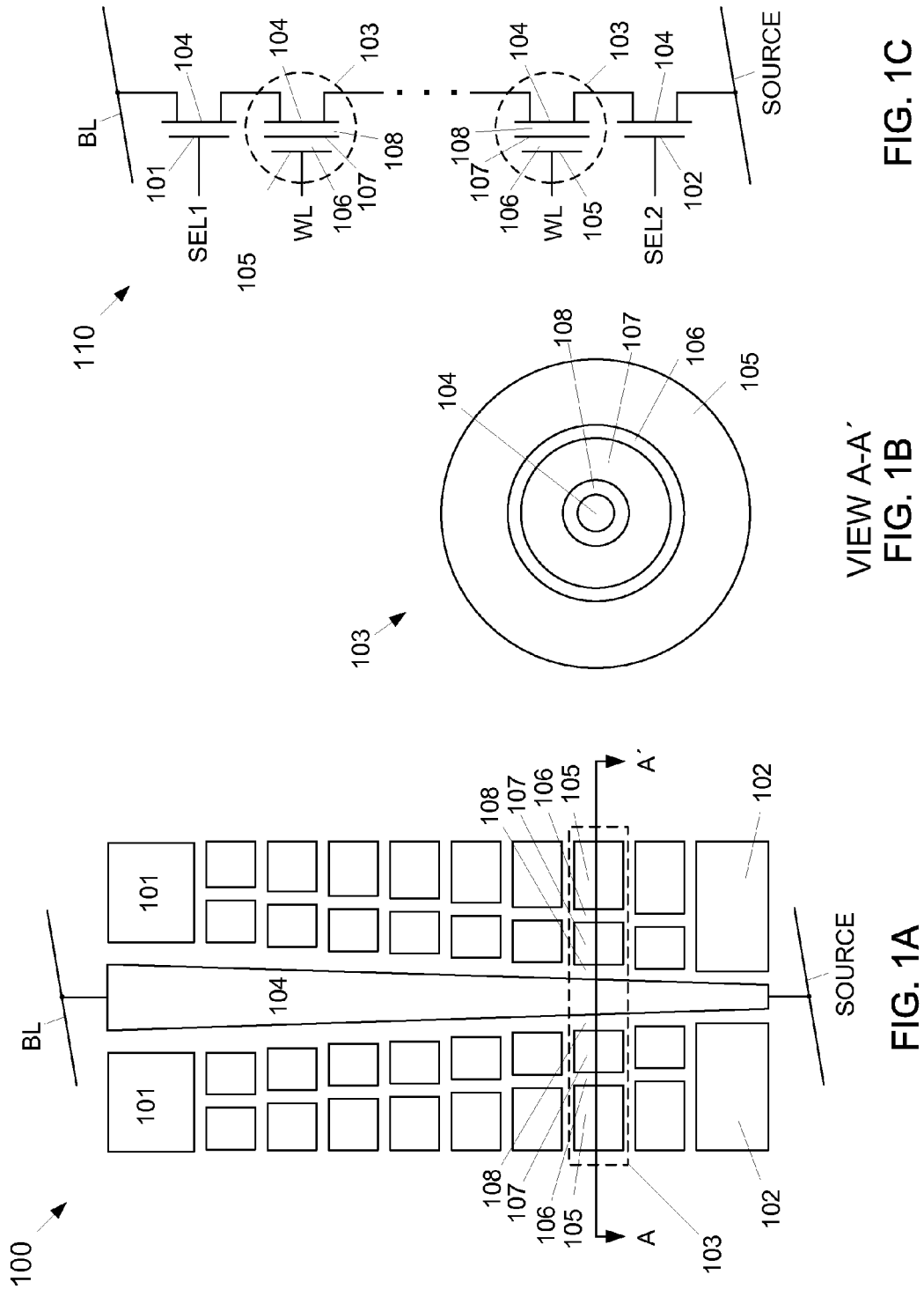

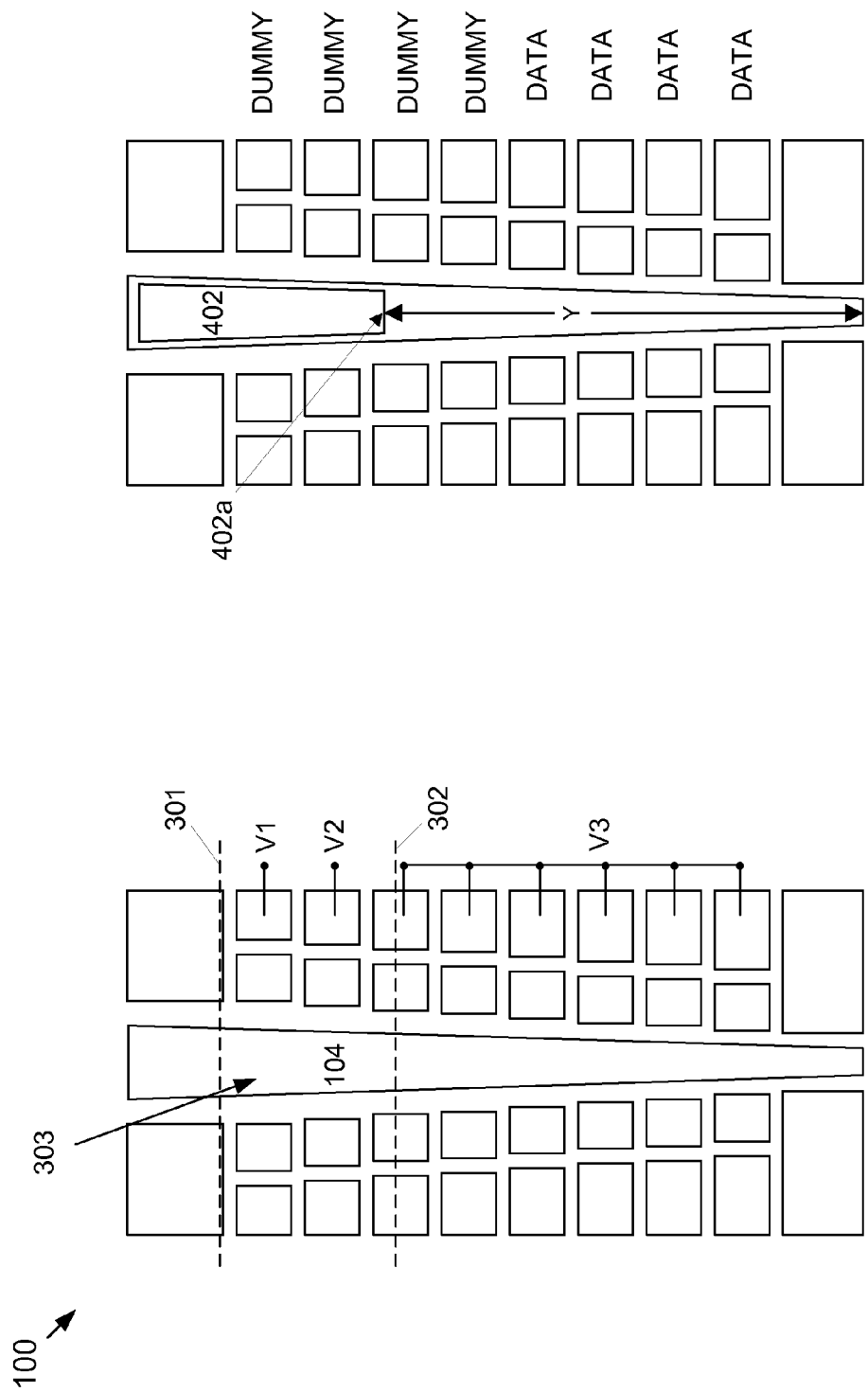

LOCAL BURIED CHANNEL DIELECTRIC FOR VERTICAL NAND PERFORMANCE ENHANCEMENT AND VERTICAL SCALING

CROSS-REFERENCE TO RELATED APPLICATIONS

The present application is a continuation of U.S. application Ser. No. 13/832,721 filed Mar. 15, 2013, pending. Said application Ser. No. 13/832,721, is hereby incorporated by reference herein in its entirety.

TECHNICAL FIELD

Embodiments of techniques described herein relate to semiconductor fabrication. In particular, the subject matter disclosed herein relates to fabricating vertical NAND strings.

BACKGROUND

Vertical NAND strings comprising a polysilicon channel may introduce several deleterious effects into fabrication/operational processes in comparison to conventional planar NAND string architectures having single crystalline silicon channels. For example, one operational challenge for a vertical NAND string relates to maintaining the boosted channel voltage on inhibited pillars during programming operations. Localized gap-state defects in the channel material, may introduce a rate-limiting channel-boost voltage-loss mechanism occurring at the edge of the string adjacent to select gate drain on program inhibited strings that potentially poses a serious limitation for achieving programming operational requirements of an array of vertical NAND strings. The voltage-loss mechanism may be unavoidable when using a non-crystalline channel material (i.e., polysilicon) under standard NAND operation conditions.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 1A depicts a side cross-sectional view of a conventional configuration for a vertical NAND string;

FIG. 1B depicts a cross-sectional view of an individual NAND cell as viewed at line A-A' in FIG. 1A;

FIG. 1C depicts a schematic diagram of a vertical NAND string in which only two individual NAND cells are depicted;

FIG. 3 depicts the conventional architecture for a vertical NAND string of FIG. 1A indicating a region where both the electric field gradient along the direction of the pillar and the channel volume are at or near a maximum;

FIG. 4 depicts allowable-depth variability for a vertical NAND string provided by a local channel dielectric according to an embodiment of the subject matter disclosed herein;

Figures 2A, 2B:
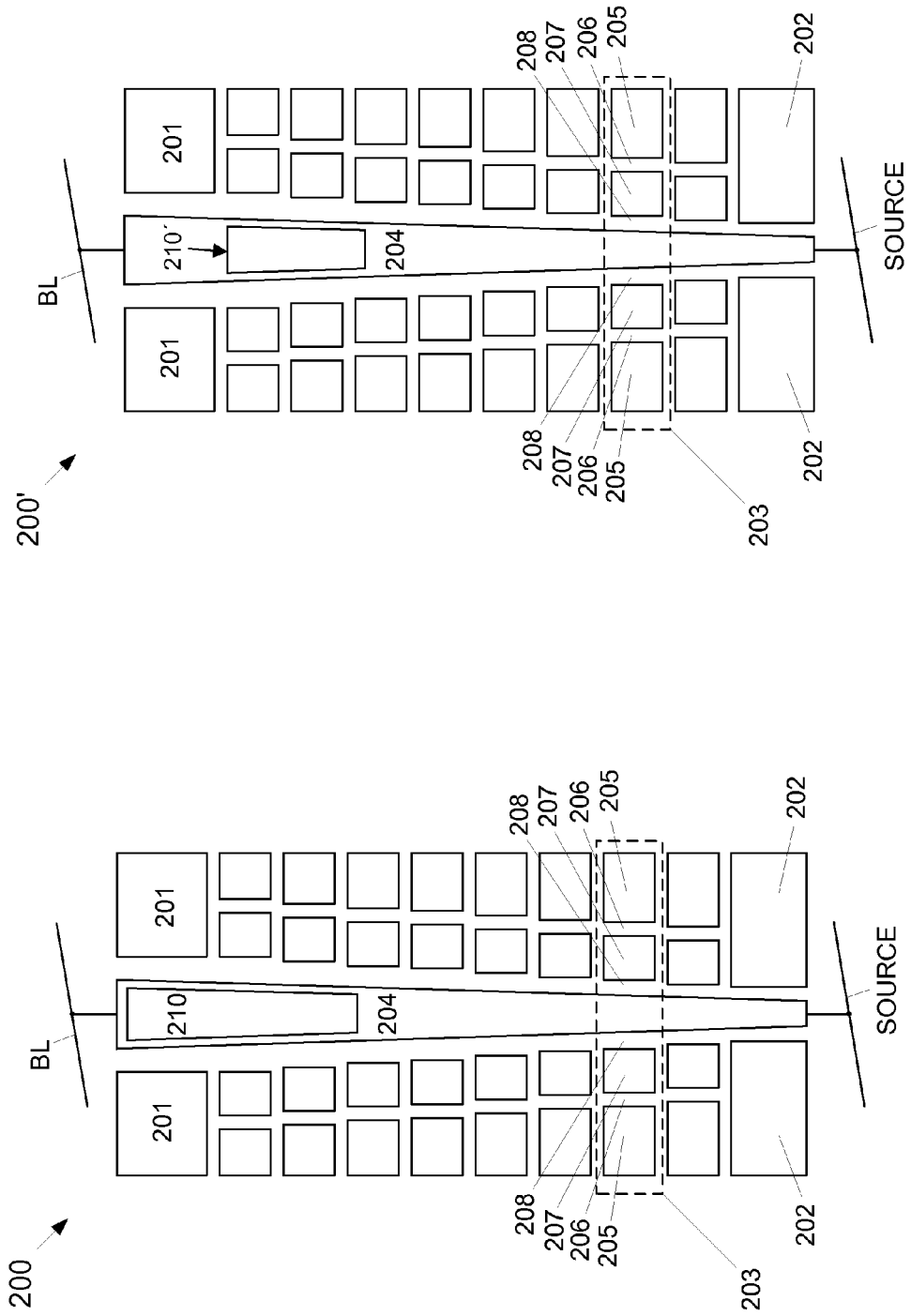
FIGS. 2A and 2B respectively depict side cross-sectional views of first and second exemplary embodiments of a vertical NAND string according to an embodiment of the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to semiconductor fabrication and, more particularly, to fabricating vertical NAND strings. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein relate to a device and a technique for fabricating a device in which a local buried channel dielectric is added to a NAND string in order to minimize a rate-limiting leakage mechanism. More specifically, a local buried oxide is added at the edge of a NAND string in order to reduce bulk channel leakage (lkg) at the edge of the NAND string where the electric field gradient along the direction of the string pillar is at or near a maximum during programming operations. The local buried oxide enhances programming capability and eases process integration in comparison to other conventional approaches for reducing the rate-limiting leakage mechanism. Moreover, the local buried channel dielectric also reduces the inherent offset between the upper and lower word lines (WLs) of a NAND string, and provides an additional degree of freedom for process control requirements on the plug depth and profile. Further, the subject matter disclosed herein is applicable to other scaling applications in which reduced thermionic field emission is utilized to achieve programming performance, such as vertically stacked arrays of vertical NAND strings. Additionally, the subject matter disclosed herein is not limited to floating gate (FG) vertical NAND devices, but is also applicable to other vertical transistor architectures, such as Charge Trap Flash (CTF) NAND devices, and can enhance performance in stacked pillar vertical NAND scaling approaches, such as, but not limited to, solid-state memory or solid-state drives (SSDs).

FIG. 1A depicts a side cross-sectional view of a conventional configuration for a vertical NAND string 100. Vertical NAND string 100 comprises a select gate drain (SGD) 101, a select gate source (SGS) 102, a plurality of individual flash cells 103 (of which only one flash cell is indicated in FIG. 1A), and a channel 104. FIG. 1B depicts a cross-sectional view of an individual NAND cell 103 as viewed at line A-A' in FIG. 1A. FIG. 1C depicts a schematic diagram 110 of vertical NAND string 100 in which only two individual NAND cells 103 are depicted.

NAND cells 103 are non-volatile memory cells that have been formed along the length of channel 104. Each individual NAND cell 103 comprises a control gate 105, a blocking dielectric 106 (also referred to as an interpoly dielectric), a charge storage node 107 (which can be a floating gate (FG) or a localized charge storage layer, such as silicon nitride in the case of CTF) (also referred to as a storage node), a tunneling dielectric 108, and a channel 104. The control gate 105 of each NAND cell 103 is coupled to a corresponding wordline (WL) (not shown in FIGS. 1A and 1B). In some embodiments of vertical NAND string 100, some of NAND cells 103 toward the SGD end of channel 104 are "dummy" NAND cells that may or may not store data, and some NAND cells 103 toward the SGS end of channel 104 are NAND cells that store data (data cells).

Channel 104 is connected at one end to a bit line (BL) and at the other end to a Source. A SEL1 signal applied to SGD 101 controls conduction through channel 104 at the BL end of channel 104, and a SEL2 signal applied to SGS 102 controls conduction through channel 104 at the Source end of channel 104. Although FIG. 1B depicts channel 104 as comprising a generally round cross-sectional area, it should be understood that channel 104 could have a wide range of cross-sectional areas that provide a functionality that is similar to a generally round cross-sectional area.

Vertical NAND string 100 comprises a polysilicon channel 104 that gives rise to several detrimental effects or fabrication/operational challenges in comparison to planar NAND string architectures that also comprise polysilicon channels. For example, one critical operational challenge for a vertical NAND string relates to maintaining the boosted channel voltage on inhibited pillars during programming operations. Localized gap-state defects in the polysilicon of channel 104, which are inherent to the polysilicon channel material, cause a rate-limiting channel-boost leakage mechanism (i.e., the rate of voltage loss) at the edge of the string adjacent to SGD 101 that poses a serious limitation for achieving programming operational requirements of an array of vertical NAND strings.

The channel-boost leakage mechanism for the conventional vertical NAND string 100 occurs at the string edge where both the electric field gradient along the direction of the pillar and the channel volume (i.e., localized gap-state defects in the channel) are at or near a maximum. The region of NAND string 100 where the electric field gradient along the direction of the pillar and the channel volume are at or near a maximum is depicted in FIG. 3 between the two dashed horizontal lines 301 and 302. In particular, the voltage gradient along channel 104 and the channel volume maximum or near maximum are indicated at 303. In FIG. 3, voltage V1≠ voltage V2≠ voltage V3.

One conventional approach for addressing the leakage mechanism has been to increase the number of wordlines (WLs) in the vicinity of SGD 101 in order to reduce the electric field and the resulting leakage. Such an approach results in an increased difficulty for the high-aspect ratio pillar etch. Moreover, increasing the number of WLs also increases the volume over the region in which the gap-state-defect leakage occurs and, consequently, reduces the efficacy of adding more WLs and tends to increase the temperature dependency of the gap-state defect-based leakage. Thus, both the increased difficulty of the high-aspect ratio pillar etch and the tendency to adversely increase the temperature dependency of the leakage results in rapidly diminishing returns for the conventional approach of increasing the number of WLs.

Another conventional approach has been to use a hollow channel in which a thin channel exists along the entire length of a vertical NAND string to address the bulk channel defects, but this conventional approach presents significant process integration challenges that reduce the net benefit, such as conformally depositing a channel film in a high-aspect ratio channel pillar without introducing additional undesirable variabilities.

FIGS. 2A and 2B respectively depict side cross-sectional views of first and second exemplary embodiments of a vertical NAND string 200 and 200' according to the subject matter disclosed herein. Vertical NAND string 200 is similar to conventional vertical NAND string 100 in that vertical NAND string 200 comprises a select gate drain (SGD) 201, a select gate source (SGS) 202, a plurality of individual flash cells 203 (of which only one is indicated in FIGS. 2A and 2B), and a channel 204. The cross-sectional view of an individual NAND cell 203 is similar to the cross-sectional view depicted in FIG. 1A for conventional NAND cell 103. The schematic diagram for NAND string 200 (not shown) is also similar to the schematic diagram for vertical NAND string 100, which is depicted in FIG. 1C.

NAND cells 203 are non-volatile memory cells that have been formed along the length of channel 204. Each individual NAND cell 203 comprises a control gate 205, a blocking dielectric 206 (also referred to as an interpoly dielectric), a floating gate (FG) 207 (also referred to as a storage node), a tunneling dielectric 208, and a channel 204. The control gate 205 of each NAND cell 203 is coupled to a corresponding wordline (WL) (not shown in FIGS. 2A and 2B). In some exemplary embodiments of vertical NAND string 200, some of NAND cells 203 that are formed toward the SGD end of channel 204 are dummy NAND cells, and some NAND cells 203 formed toward the SGS end of channel 204 are data NAND cells.

Channel 204 is connected at one end to a bit line (BL) and at the other end to a Source. A SEL1 signal applied to SGD 201 controls conduction through channel 204 at the BL end of channel 204, and a SEL2 signal applied to SGS 202 controls conduction through channel 204 at the Source end of channel 204. Although one exemplary embodiment of channel 204 may comprise a generally round cross-sectional area, it should be understood that channel 204 could have a wide range of cross-sectional areas that provide a functionality that is similar to a generally round cross-sectional area.

Vertical NAND strings 200 and 200' (see FIG. 2B) differ from conventional vertical NAND string 100 by including a local buried channel dielectric 210 or 210' that is formed within channel 204 and is located in a region of channel 204 that is in proximity to SGD transistor 201 where both the electric field gradient (along the direction of the pillar) and the channel volume (localized gap-state defects in the channel) are a maximum or near a maximum. In particular, FIG. 2A depicts a vertical NAND string 200 that comprises a local channel dielectric 210 that extends through channel 204 up through SGD device 201. FIG. 2B depicts a vertical NAND string 200' that comprises a local channel 210' that does not extend up through SGD device 201. In one exemplary embodiment, local buried channel dielectric 210, 210' is formed within channel 204 so that the length of channel 204 remains conductive. In one exemplary embodiment, local dielectric 210, 210' is formed so that the sidewalls of channel 204 are about 20 nm thick between the outside edges of local dielectric 210, 210' and the outside edge of channel 204 (see widths 1620 in FIG. 16). In one exemplary embodiment, the cross-sectional area of local dielectric 210, 210' may comprise a generally round cross-sectional area, although it should be understood that local dielectric 210, 210' could have a wide range of cross-sectional areas that provide a functionality that is similar to a generally round cross-sectional area.

Channel leakage is at or near a maximum in the region where electric field gradient and channel volume are maximum. The inclusion of buried channel dielectric 210, 210' at the location that the channel-boost leakage is at or near a maximum may significantly reduce and/or minimize the dominant leakage component. The addition of channel dielectric 210, 210' eliminates the fabrication challenges that are associated with the conventional approach of adding more WLs. That is, in contrast to conventional approaches for addressing the channel boost leakage mechanism in which the upper part of the string includes only dummy cells and additional WLs, embodiments of the subject matter disclosed herein reduce the rate-limiting leakage current at or near at least one critical location and ease integration and process control by providing a comparatively lower aspect ratio NAND string. Moreover, the approach of embodiments of the subject matter disclosed herein preserve string current for inversion-mode devices in which the desired channel current is localized at the outer surface of the pillar.

FIG. 4 depicts allowable-depth variability for a vertical NAND string provided by a local channel dielectric according to embodiments of the subject matter disclosed herein. The distance Y in FIG. 4 represents the height of the bottom of the local channel dielectric 402 above the bottom of the channel, which distance can vary depending upon the number of dummy WLs that are used at the edge of the NAND string. That is, the height Y can be selected to optimize the string edge WL biasing scheme and to minimize the undesired channel boost leakage mechanism. It should be understood that the number of dummy WLs shown in FIG. 4 is only exemplary, and will vary depending on design parameters for the vertical NAND string.

Figure 5:
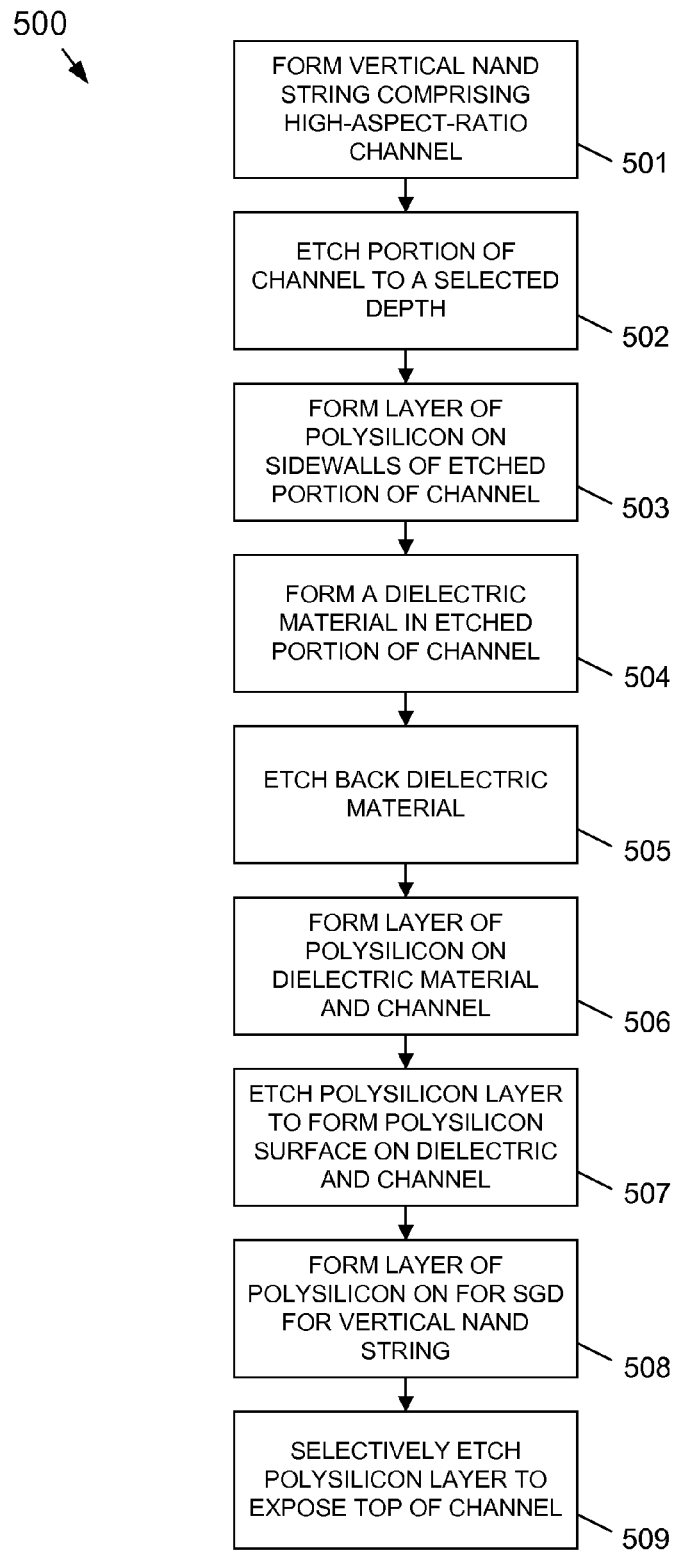
FIG. 5 depicts a flow diagram for one exemplary embodiment of a technique for forming a buried channel dielectric in a channel of a vertical NAND string according to an embodiment of the subject matter disclosed herein.
Figure 6A:
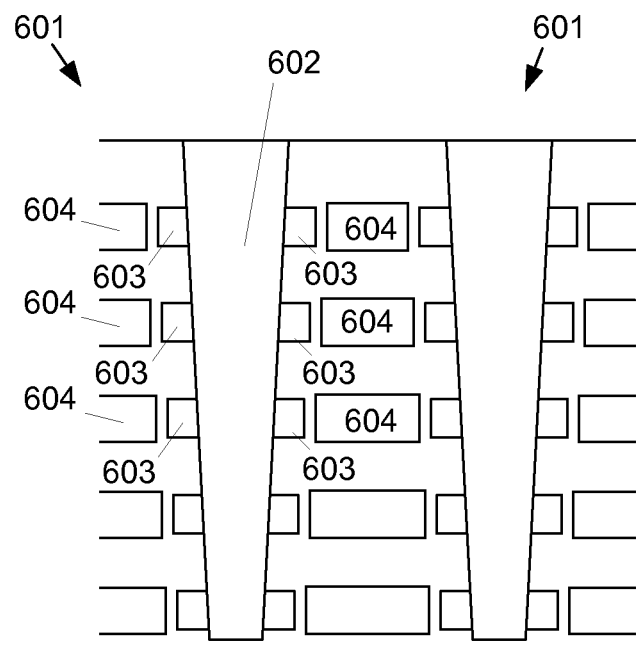
FIGS. 6A-6I depict the various stages of the flow diagram of FIG. 5 for two vertical NAND strings of an array of vertical NAND strings.

FIG. 5 depicts a flow diagram 500 for one exemplary embodiment of a technique for forming a buried channel dielectric in a channel of a vertical NAND string according to the subject matter disclosed herein. FIGS. 6A-6I depict the various stages of the flow diagram of FIG. 5 for two vertical NAND strings of an array of vertical NAND strings. At 501, a vertical NAND string 601 comprising a high-aspect-ratio channel 602 has been formed in a well-known manner. FIG. 6A depicts two vertical NAND strings 601 of an array of vertical NAND strings (not shown). As also depicted in FIG. 6A, NAND string 601 also comprises a plurality of flash cells 603 (of which only a few flash cells are indicated) and corresponding WLs 604 (of which only a few WLs are indicated). Channel 602 has been formed in a well-known manner from a non-crystalline material, such as, but not limited to, polysilicon. Other suitable materials for channel 602 include, but are not limited to, polysilicon films and amorphous silicon-based films and their alloys, such as, but not limited to, polysilicon-germanium, polysilicon-carbide and amorphous silicon-carbide.

Figure 6B:
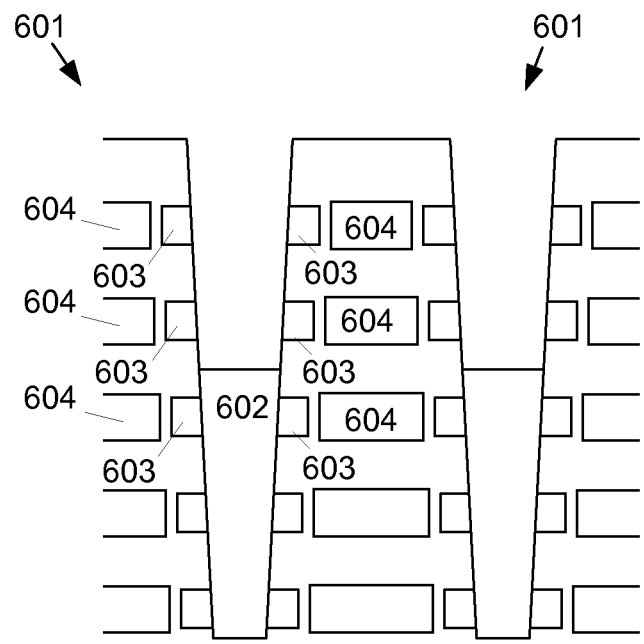
Figure 6C:
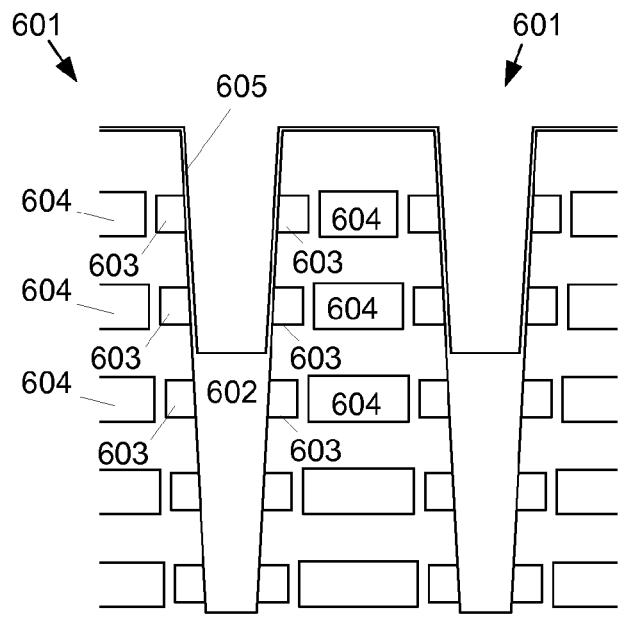
Figure 6D:
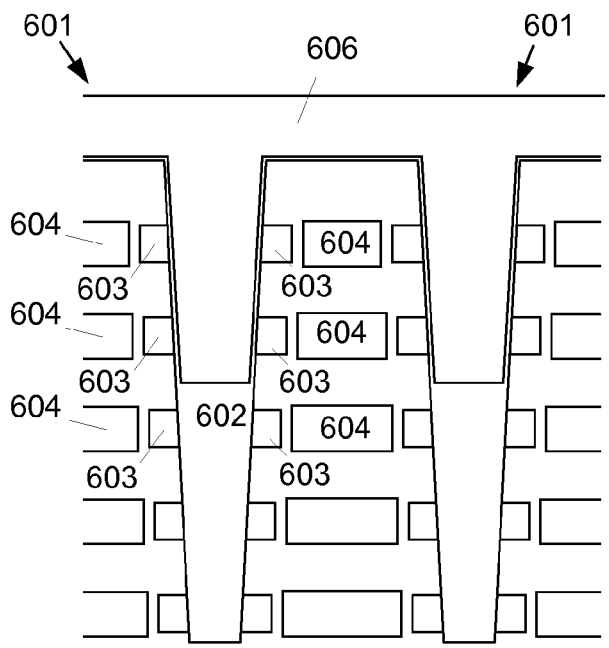
Figure 6E:
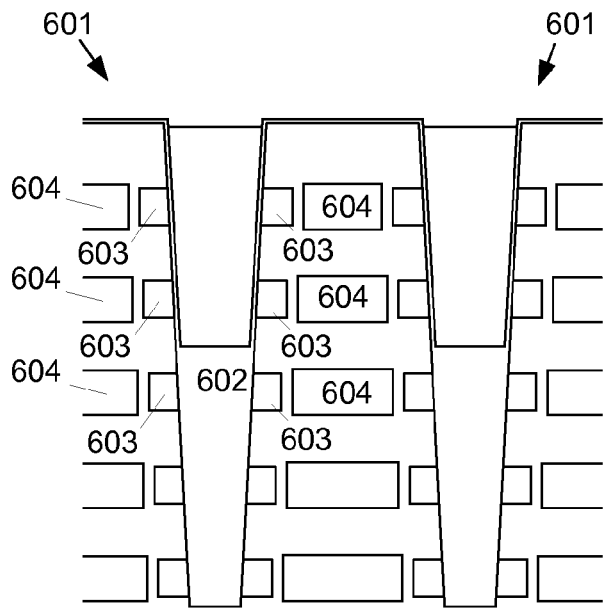
Figure 6F:
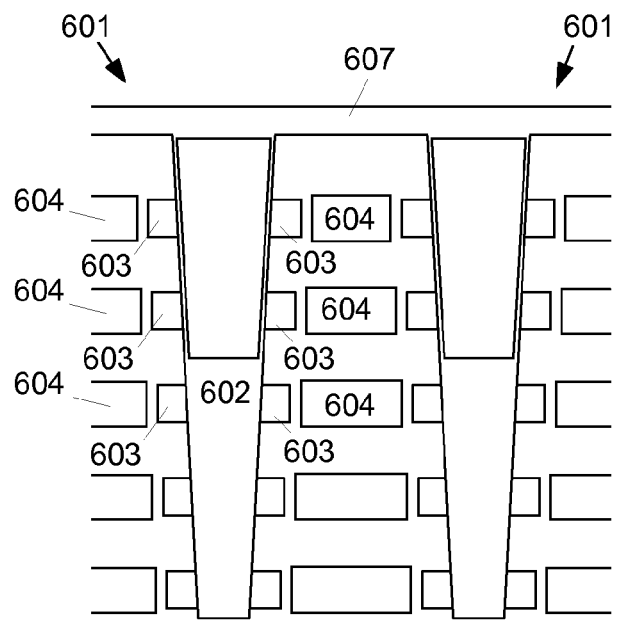
Figure 6G:
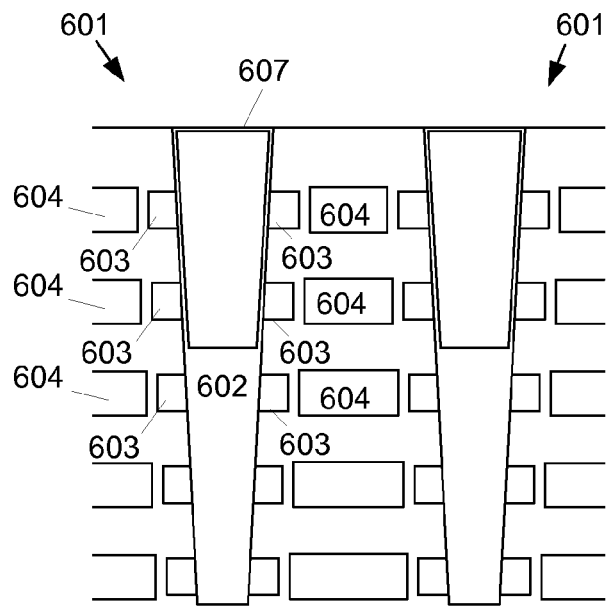
Figure 6H:
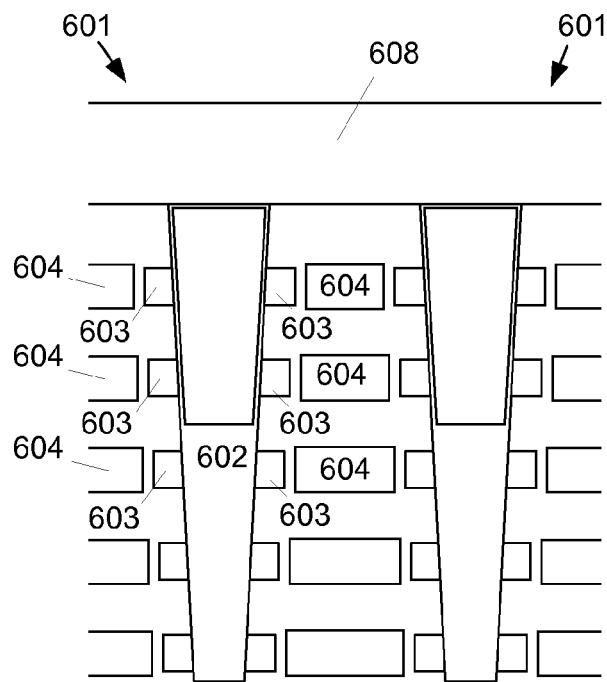
Figure 6I:
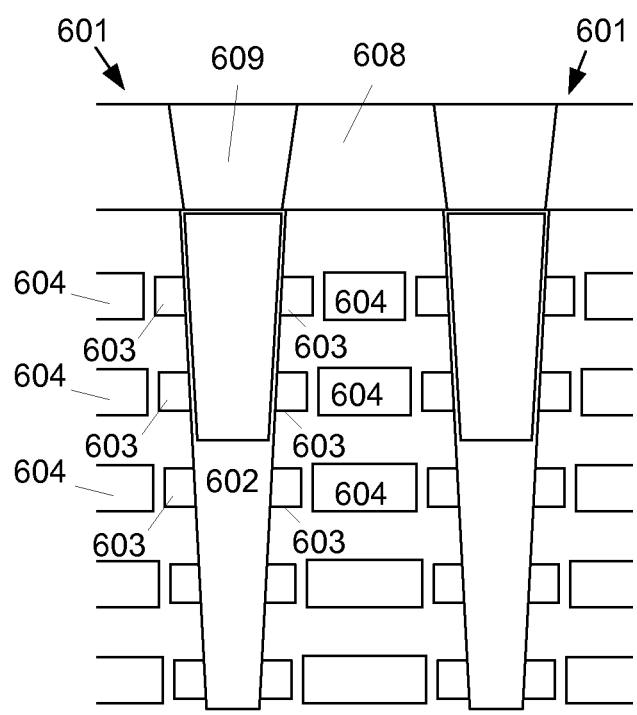

At 502, a portion of channel 602 is etched in a well-known manner to a selected depth (FIG. 6B). At 503, a layer 605 of non-crystalline material, such as, but not limited to, polysilicon, is formed in a well-known manner on the walls of the portion of channel 602 that has been etched (FIG. 6C). At 504, a dielectric material 606, such as but not limited to, silicon dioxide, air, inert gas, etc., is formed in a well-known manner using an atomic layer deposition (ALD) technique to fill the remaining portion of channel 602 (FIG. 6D). At 505, dielectric material 606 is etched back in a well-known manner so that only the portion filling channel 602 remains after etching (FIG. 6E). At 506, a layer 607 of polysilicon is formed in a well-known manner to cover dielectric material 606 (FIG. 6F). At 507, layer 607 is etched back in a well-known manner so that channel 602 has a polysilicon surface on which the rest of channel 602 is formed (FIG. 6G). Etched-back layer 607 forms a cap on the dielectric materials 606 remaining in channel 602. At 508, a layer 608 of polysilicon material is formed in a well-known manner (FIG. 6H). Polysilicon layer 608 will be used to form a select gate drain (SGD) for vertical NAND string 601. At 509, polysilicon layer 608 is selectively removed at 609 in a well-known manner to expose the top of channel 602 (FIG. 6I). The remainder of vertical NAND string 601 is formed and completed in a well-known manner.

Figure 7:
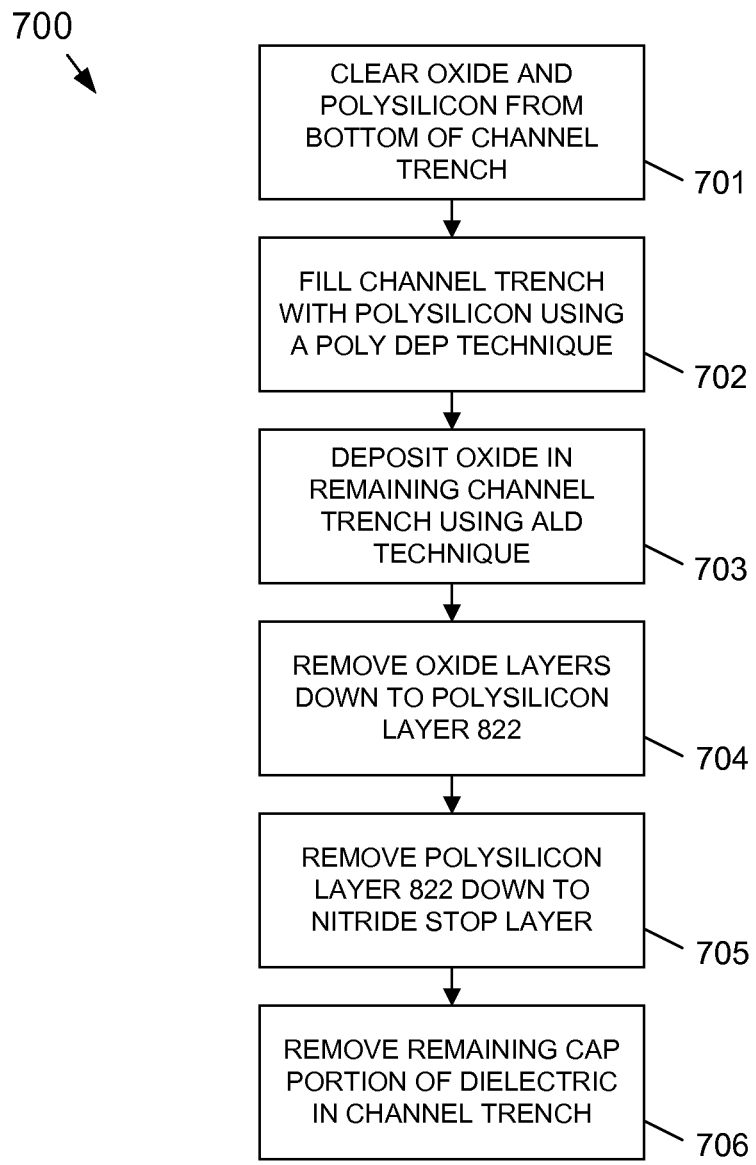
FIG. 7 depicts a flow diagram for another exemplary embodiment of a technique for forming a buried channel dielectric in a channel of a vertical NAND string according to an embodiment of the subject matter disclosed herein.
Figure 8A:
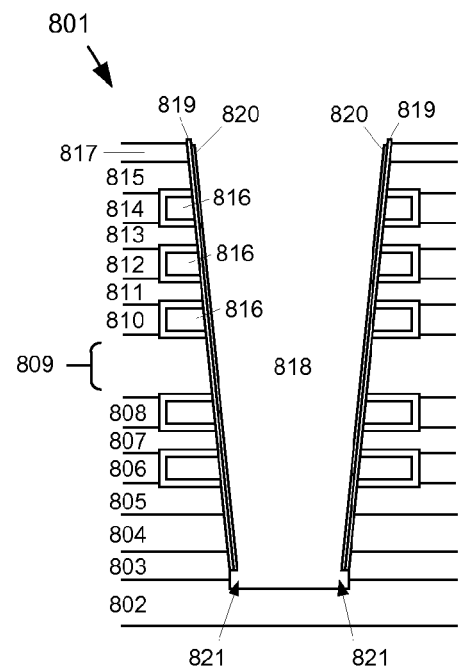
FIGS. 8A-8F depict various stages of the flow diagram of FIG. 7 for a vertical NAND string of an array of vertical NAND strings according to embodiments of the subject matter disclosed herein.

FIG. 7 depicts a flow diagram 700 for another exemplary embodiment of a technique for forming a buried channel dielectric in a channel of a vertical NAND string according to the subject matter disclosed herein. FIG. 8A depicts a vertical NAND string 801 during fabrication. In particular, vertical NAND string 801 has been formed in a well-known manner to comprise a source 802, a first oxide layer 803, an SGS layer 804, a second oxide layer 805, a first WL 806, a third oxide layer 807, a second WL layer 808, an oxide separation region 809 between dummy cells (above region 809) and data cells (below region 809), a third WL layer 810, a fourth oxide layer 811, a fourth WL layer 812, a fifth oxide layer 813, a fifth WL layer 814, and a sixth oxide layer 815. Additionally, a plurality of dummy and data flash cells 816 have been formed, of which only a few are indicated. A silicon nitride stop layer 817 has also been formed in a well-known manner on oxide layer 815 to have a thickness of about 100 Å. A high-aspect ratio channel trench 818 has been formed in a well-known manner. An oxide layer 819 and a polysilicon liner 820 have been formed in a well-known manner in channel trench 818.

Figure 8B:
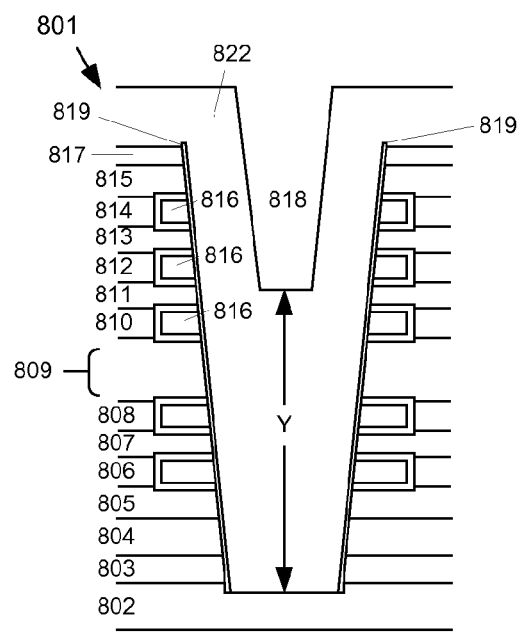

At 701, an etch process clears oxide layer 819 and polysilicon layer 820 from the bottom 821 of channel trench 818. FIG. 8A depicts vertical NAND string 801 in which oxide layer 819 and polysilicon liner 820 have been cleared from the bottom 821 of channel trench 818. At 702, a polysilicon layer 822 is formed on silicon nitride stop layer 817 and in channel trench 818 using a polysilicon deposition technique, such as but not limited to, low-pressure chemical vapor deposition (LPCVD) to a specific height Y in the channel. FIG. 8B depicts a polysilicon fill of channel trench 818 to height Y, which is selected based on the final configuration of vertical NAND string 801.

Figure 8C:
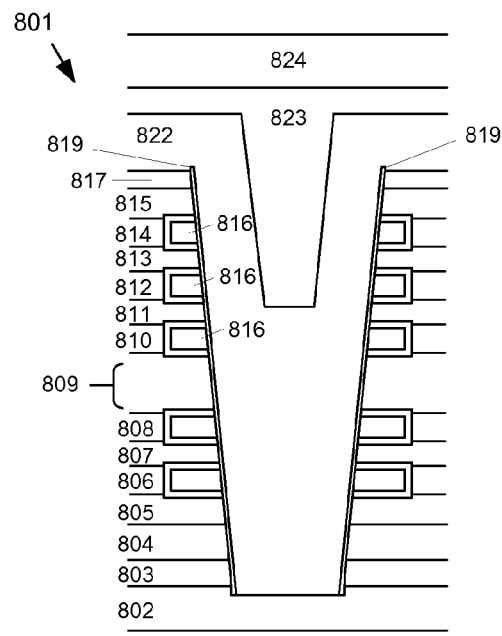
Figure 8D:
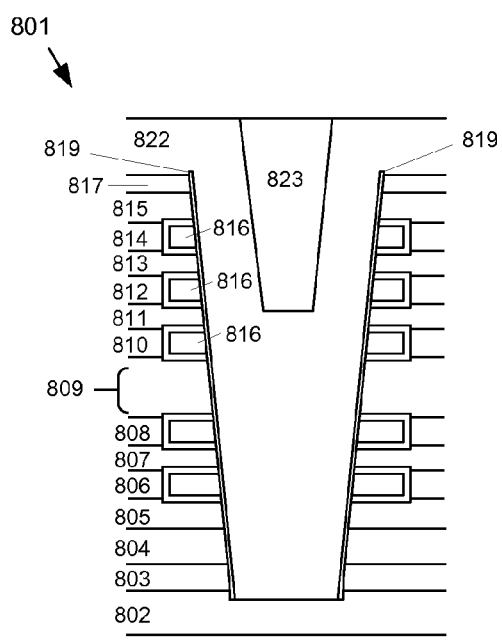

At 703, an oxide layer 823 is deposited on the polysilicon layer 822 and into the remaining channel trench 818 using a well-known atomic layer deposition (ALD) technique to prevent seams in the oxide in the channel trench. Additionally, an oxide layer 824 is deposited on oxide layer 823 using well-known oxide-fill techniques to allow a chemical-mechanical polishing (CMP) overburden. FIG. 8C depicts vertical NAND string 801 with oxide layers 823 and 824. At 704, oxide layers 823 and 824 are removed down to polysilicon layer 822 using a well-known chemical-mechanical polished (CMP) technique. FIG. 8D depicts vertical NAND string 801 with oxide layers 823 and 824 removed down to polysilicon layer 822.

Figure 8E:
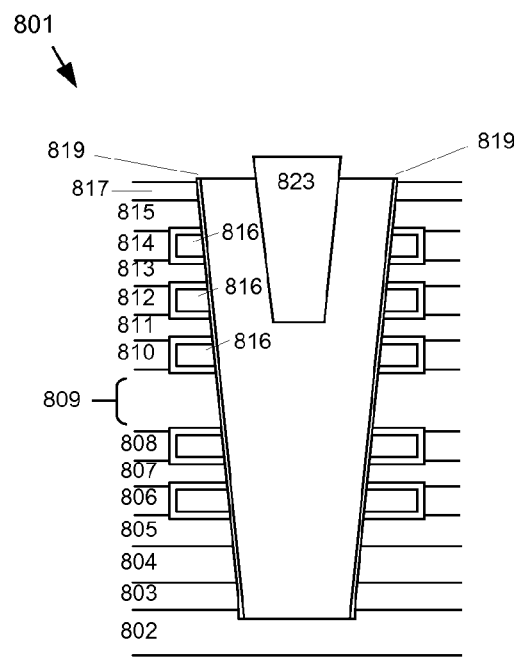
Figure 8F:
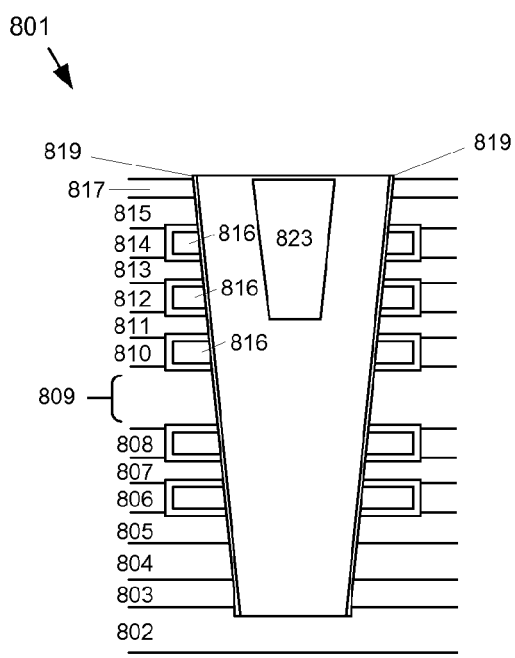

At 705, a well-known non-selective CMP technique is used to remove polysilicon layer 822 down to silicon nitride stop layer 817. Additionally, a portion of oxide 823 is removed during the non-selective CMP technique. FIG. 8E depicts vertical NAND string 801 after the non-selective CMP technique at 705 of FIG. 7. At 706, a non-selective CMP technique is used to remove the portion of oxide 823 remaining after the non-selective CMP technique at 705 and silicon nitride stop layer 817. FIG. 8F depicts vertical NAND string 801 after removal of the portion of oxide 823 remaining after the non-selective CMP technique at 705 and silicon nitride stop layer 817. Processing continues and the remainder of vertical NAND string 801 is formed in a well-known manner, such as described in connection with FIG. 5.

Figure 9:
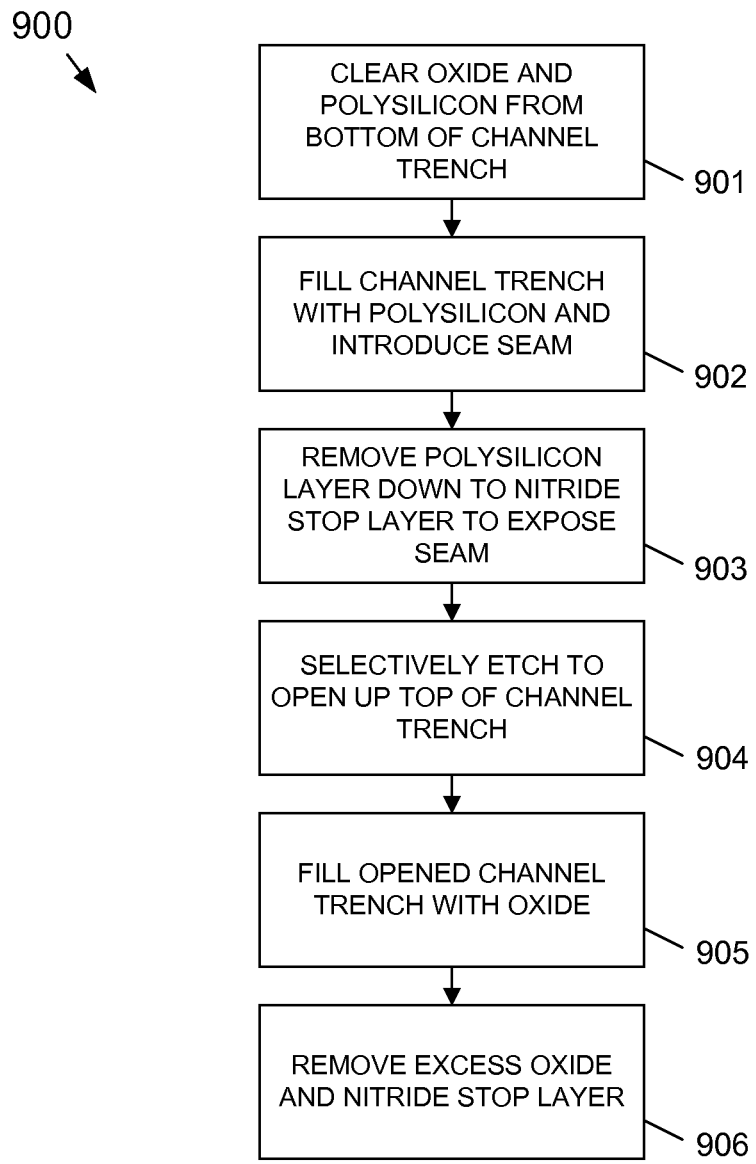
FIG. 9 depicts a flow diagram for still another exemplary embodiment of a technique for forming a buried channel dielectric in a channel of a vertical NAND string according to the subject matter disclosed herein.
Figure 10A:
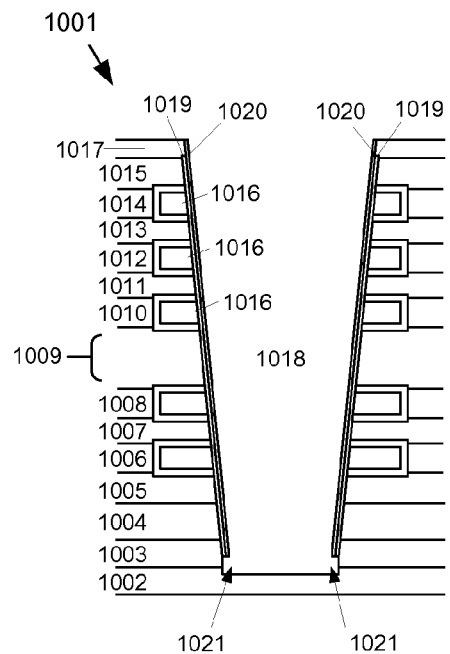
FIGS. 10A-10F depict various stages of the flow diagram of FIG. 9 for a vertical NAND string of an array of vertical NAND strings according to embodiments of the subject matter disclosed herein.

FIG. 9 depicts a flow diagram 900 for still another exemplary embodiment of a technique for forming a buried channel dielectric in a channel of a vertical NAND string according to the subject matter disclosed herein. FIG. 10A depicts a vertical NAND string 1001 during fabrication. In particular, vertical NAND string 1001 has been formed in a well-known manner to comprise a source 1002, a first oxide layer 1003, an SGS layer 1004, a second oxide layer 1005, a first WL 1006, a third oxide layer 1007, a second WL layer 1008, an oxide separation region 1009 between dummy cells (above region 1009) and data cells (below region 1009), a third WL layer 1010, a fourth oxide layer 1011, a fourth WL layer 1012, a fifth oxide layer 1013, a fifth WL layer 1014, and a sixth oxide layer 1015. Additionally, a plurality of dummy and data flash cells 1016 have been formed, of which only a few are indicated. A silicon nitride stop layer 1017 has also been formed in a well-known manner on oxide layer 1015 to have a thickness of about 100 Å. A high-aspect ratio channel trench 1018 has been formed in a well-known manner. An oxide layer 1019 and a polysilicon liner 1020 have been formed in a well-known manner channel trench 1018.

Figure 10B:
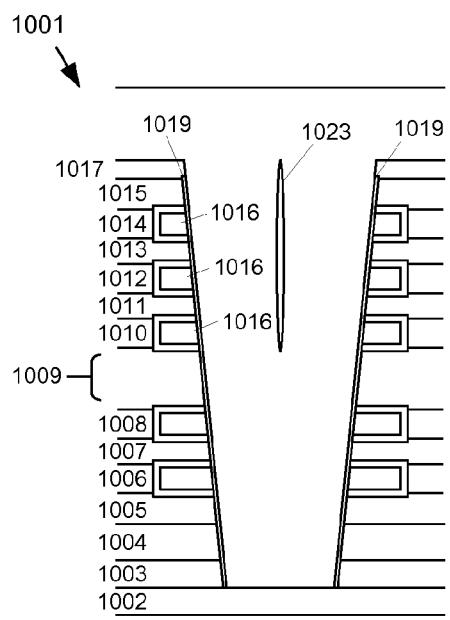

At 901, an etch process clears oxide layer 1019 and polysilicon liner 1020 from the bottom 821 of channel trench 818. FIG. 10A depicts vertical NAND string 1001 in which oxide layer 1019 and polysilicon liner 1020 have been cleared from the bottom 1021 of channel trench 1018. At 902, a polysilicon channel layer 1022 (see FIG. 10B) is formed in a well-known manner on silicon nitride stop layer 1017 and in channel trench 1018. Layer 1022 is deposited using a film with step-coverage characteristics to introduce a seam/void 1023 during the deposition process that fills the channel trench. FIG. 10B depicts polysilicon layer 1022, the polysilicon fill of the channel trench, and seam 1023.

Figure 10C:
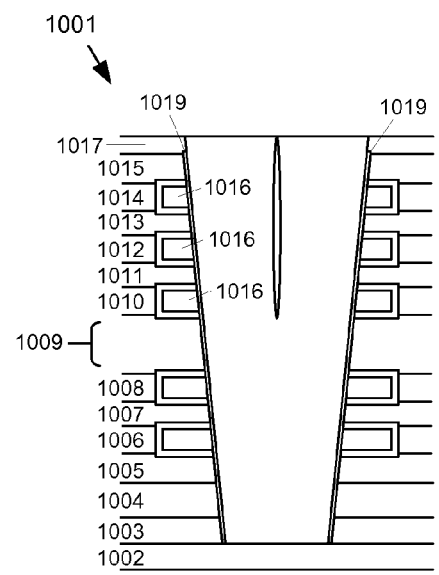
Figure 10D:
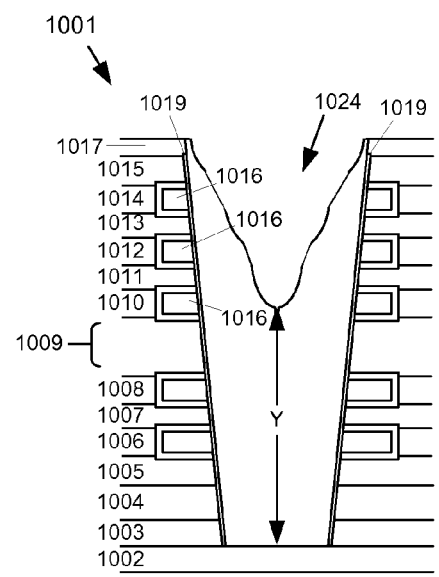

At 903, polysilicon layer 1022 is removed down to silicon nitride stop layer 1017 using a well-known CMP technique and so the top of the filled channel trench and seam 1023 are exposed. FIG. 10C depicts vertical NAND string 1001 with polysilicon layer 1022 removed. At 904, a wet-etch process that is selective to oxide is used to open up the top of the channel trench at 1024. The formation of seam 1024, the channel diameter critical dimension and the wet-etch process are optimized to selectively set the depth of the opening and the height Y of the channel based on, but not limited to, channel diameter. FIG. 10D depicts vertical NAND string 1001 after being wet etched to open up the top of the channel trench at 1024.

Figure 10E:
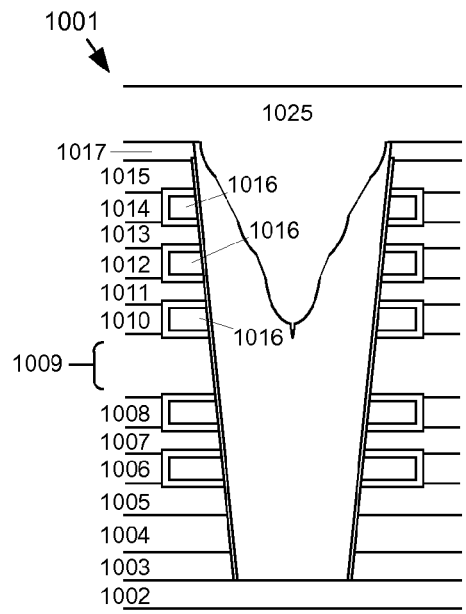
Figure 10F:
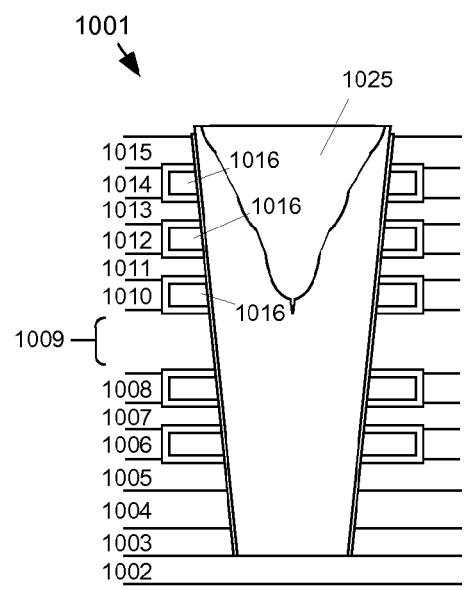

At 905, an oxide layer 1025 is formed in a well-known manner on silicon nitride stop layer 1017 so that the channel trench is filled with oxide. FIG. 10E depicts vertical NAND string 1001 after oxide layer 1025 has been formed. At 906, oxide layer 1025 is removed using a well-known oxide CMP technique. Afterward, silicon nitride stop layer 1017 is removed using well-known silicon nitride etch removal techniques. FIG. 10F depicts vertical NAND string 1001 after oxide layer 1025 and silicon nitride stop layer 1027 have been removed. Processing continues and the remainder of vertical NAND string 1001 is formed in a well-known manner, such as described in connection with FIG. 5.

Figure 11:
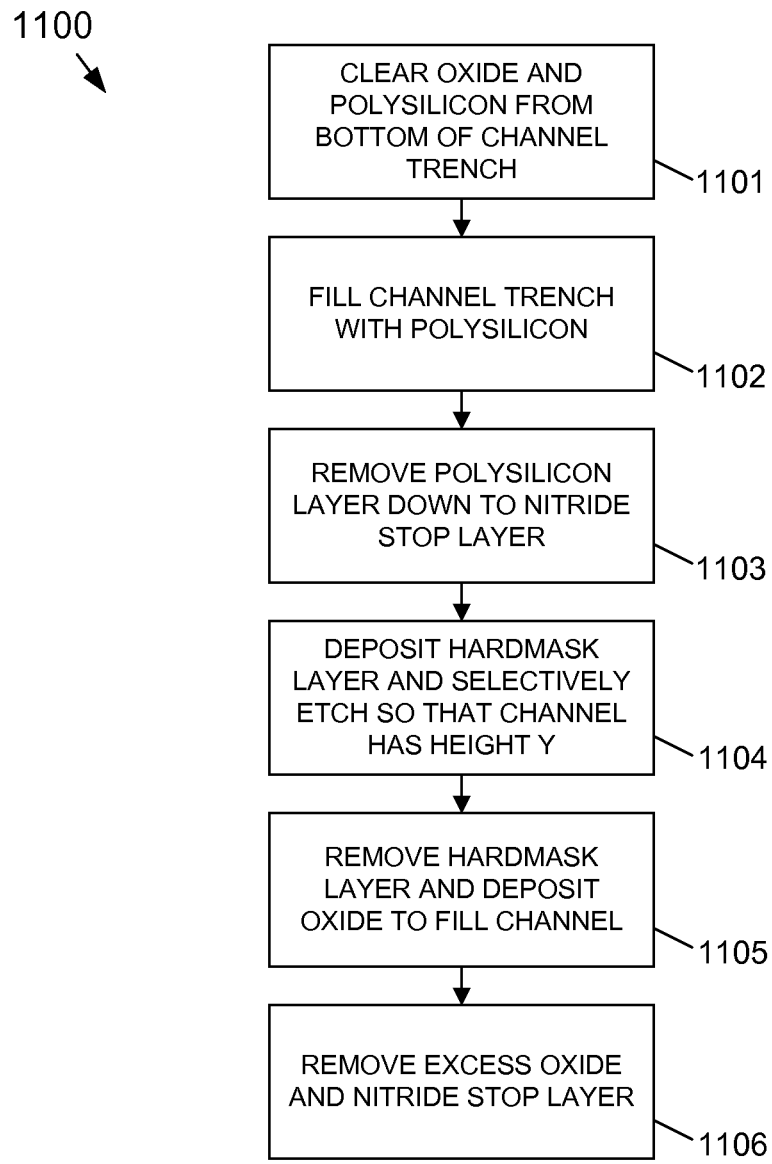
FIG. 11 depicts a flow diagram for yet another exemplary embodiment of a technique for forming a buried channel dielectric in a channel of a vertical NAND string according to the subject matter disclosed herein.
Figure 12A:
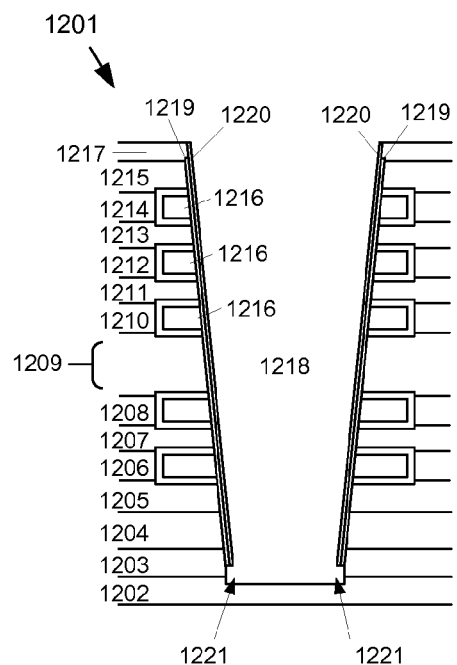
FIGS. 12A-12F depict various stages of the flow diagram of FIG. 11 for a vertical NAND string of an array of vertical NAND strings according to embodiments of the subject matter disclosed herein.

FIG. 11 depicts a flow diagram 1100 for yet another exemplary embodiment of a technique for forming a buried channel dielectric in a channel of a vertical NAND string according to the subject matter disclosed herein. FIG. 12A depicts a vertical NAND string 1201 during fabrication. In particular, vertical NAND string 1201 has been formed in a well-known manner to comprise a source 1202, a first oxide layer 1203, an SGS layer 1204, a second oxide layer 1205, a first WL 1206, a third oxide layer 1207, a second WL layer 1208, an oxide separation region 1209 between dummy cells (above region 1209) and data cells (below region 1209), a third WL layer 1210, a fourth oxide layer 1211, a fourth WL layer 1212, a fifth oxide layer 1213, a fifth WL layer 1214, and a sixth oxide layer 1215. Additionally, a plurality of dummy and data flash cells 1216 have been formed, of which only a few are indicated. A silicon nitride stop layer 1217 has also been formed in a well-known manner on oxide layer 1215 to have a thickness of about 100 Å. A high-aspect ratio channel trench 1218 has been formed in a well-known manner. An oxide layer 1219 and a polysilicon liner 1220 have been formed in a well-known manner channel trench 1218.

Figure 12B:
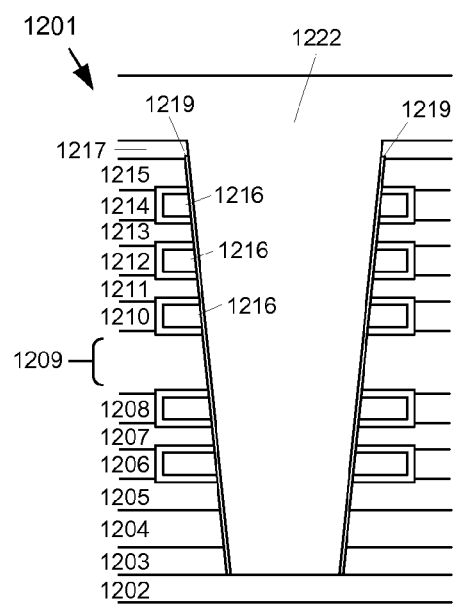

At 1101, an etch process clears oxide layer 1219 and polysilicon liner 1220 from the bottom 1221 of channel trench 1218. FIG. 12A depicts vertical NAND string 1201 in which oxide layer 1219 and polysilicon liner 1220 has been cleared from the bottom 1221 of channel trench 1218. At 1102, channel trench 1218 is filled with polysilicon 1222 using a well-known technique. FIG. 12B depicts vertical NAND string 1201 with polysilicon layer 1222 added.

Figure 12C:
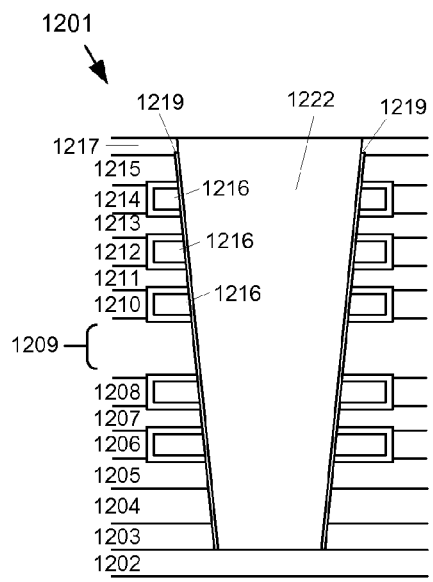
Figure 12D:
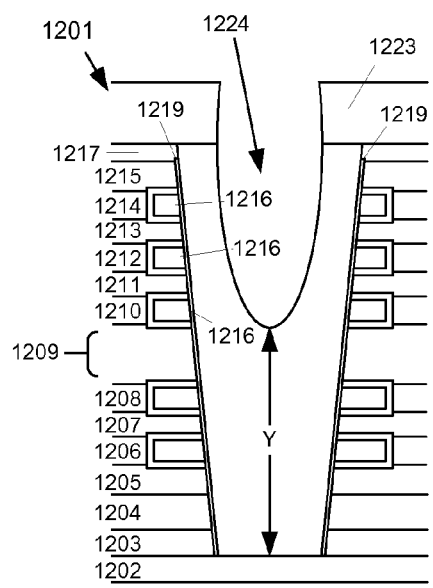

At 1103, polysilicon layer 1222 is removed down to silicon nitride stop layer 1217 using a well-known CMP technique. FIG. 12C depicts vertical NAND string 1201 with polysilicon layer 1222 removed. At 1104, a hardmask layer 1223, such as carbon, is deposited using a well-known technique. Afterwards, a well-known photolithoraphic process and dry-etch technique is used at 1224 to selectively remove hardmask layer 1223 and also to selectively remove a portion of polysilicon 1222 from the channel so that the polysilicon in the channel has a height Y, which height may be based on, but not limited to channel diameter. FIG. 12D depicts vertical NAND string 1201 after being dry etched to selectively remove hardmask layer 1223 and a portion of polysilicon 1222 from the channel so that the remaining polysilicon in the channel has a minimum height of Y.

At 1105, the hardmask layer 1223 is removed using a well-known technique, and an oxide layer 1225 is deposited using a well-known technique so that etched region 1224 is filled.

Figure 12E:
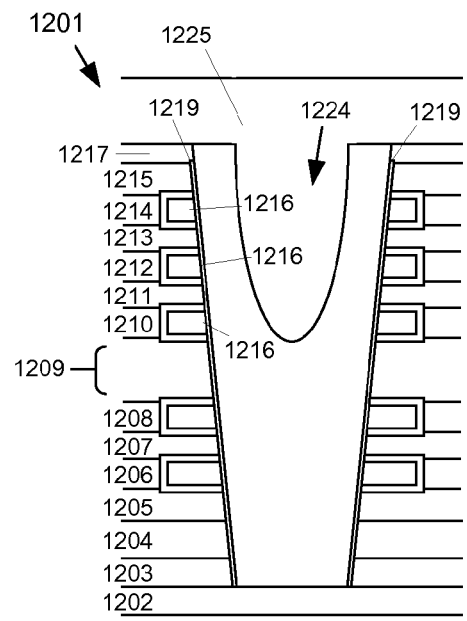
Figure 12F:
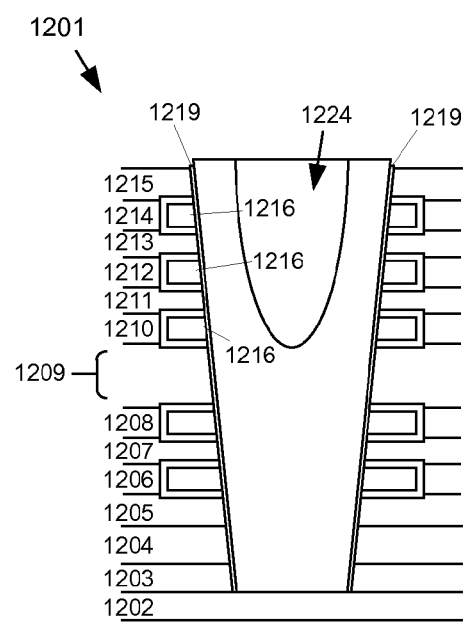

FIG. 12E depicts vertical NAND string 1201 after oxide layer 1225 is deposited. At 1106, oxide layer 1225 is removed using a well-known CMP technique, and silicon nitride stop layer 1217 is removed using a well-known wet-etch process. FIG. 12F depicts vertical NAND string 1201 after oxide layer 1225 and silicon nitride stop layer 1217 have been removed. Processing continues and the remainder of vertical NAND string 1201 is formed in a well-known manner, such as described in connection with FIG. 5.

Figure 13:
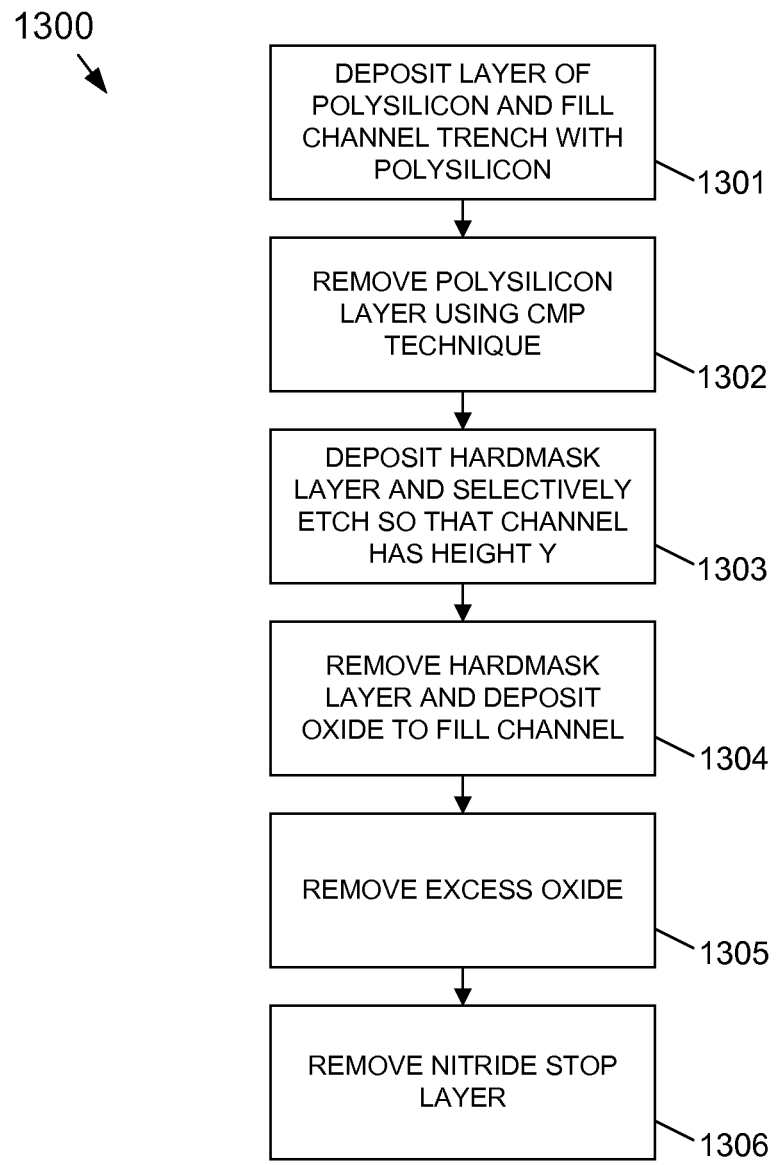
FIG. 13 depicts a flow diagram for another exemplary embodiment of a technique for forming a buried channel dielectric in a channel of a vertical NAND string according to the subject matter disclosed herein.
Figure 14A:
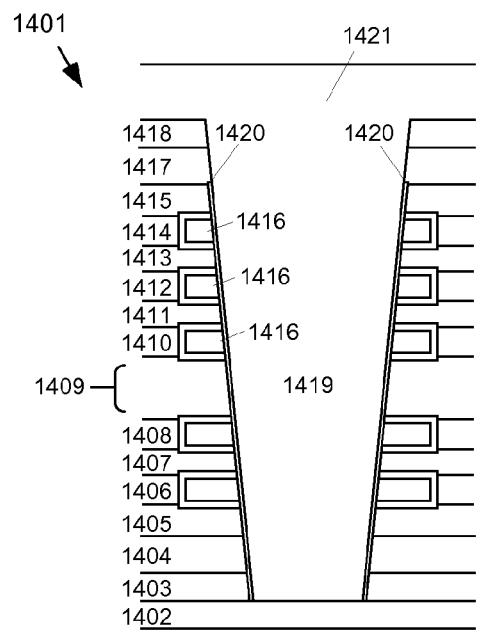
FIGS. 14A-14F depict various stages of the flow diagram of FIG. 13 for a vertical NAND string of an array of vertical NAND strings according to embodiments of the subject matter disclosed herein.

FIG. 13 depicts a flow diagram 1300 for another exemplary embodiment of a technique for forming a buried channel dielectric in a channel of a vertical NAND string according to the subject matter disclosed herein. FIG. 14A depicts a vertical NAND string 1401 during fabrication. In particular, vertical NAND string 1401 has been formed in a well-known manner to comprise a source 1402, a first oxide layer 1403, an SGS layer 1404, a second oxide layer 1405, a first WL 1406, a third oxide layer 1407, a second WL layer 1408, an oxide separation region 1409 between dummy cells (above region 1409) and data cells (below region 1409), a third WL layer 1410, a fourth oxide layer 1411, a fourth WL layer 1412, a fifth oxide layer 1413, a fifth WL layer 1414, a sixth oxide layer 1415, SGD layer 1417, and a silicon nitride stop layer 1418. Additionally, a plurality of dummy and data flash cells 1416 have been formed, of which only a few are indicated. A high-aspect ratio channel trench 1419 has been formed in a well-known manner. An oxide layer 1420 has been formed in a well-known manner in channel trench 1419.

Figure 14B:
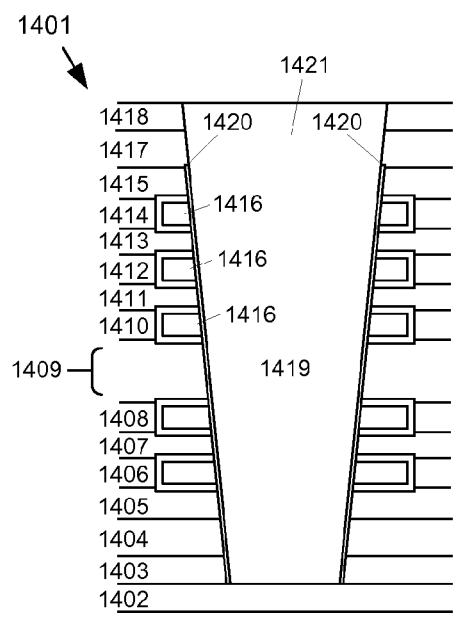

At 1301, a polysilicon layer 1421 has been formed in a well-known manner on silicon nitride stop layer 1418 so that polysilicon fills channel trench 1419. FIG. 14A depicts vertical NAND string 1401 after polysilicon layer 1421 has been deposited on silicon nitride stop layer 1418 so that polysilicon fills channel trench 1419. At 1302, polysilicon layer 1421 has been removed down to silicon nitride stop layer 1418 using a well-known CMP technique. FIG. 14B depicts vertical NAND string 1401 after a portion of polysilicon layer 1421 has been removed.

Figure 14C:
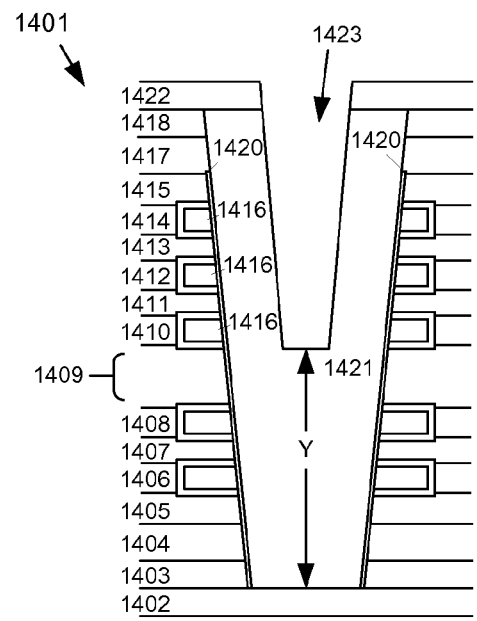
Figure 14D:
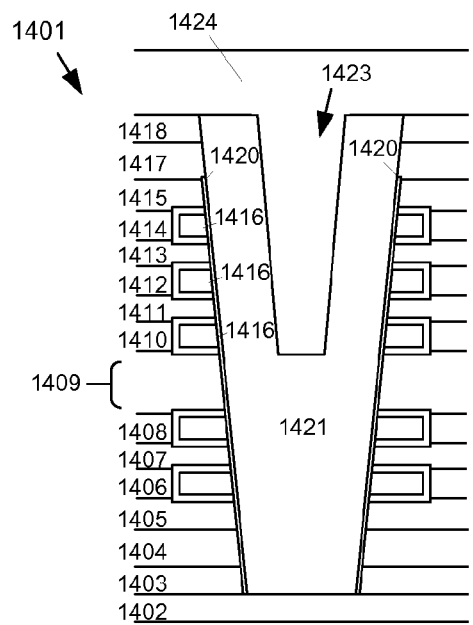

At 1303, a hardmask layer 1422 is formed in a well-known manner on silicon nitride stop layer 1418. Afterwards, a well-known photolithographic process and dry-etch technique is used at 1423 to selectively remove hardmask layer 1422 and a portion of polysilicon 1421 from the channel such that the remaining polysilicon in the channel has a minimum height of Y, which height may be based on, but not limited to, channel diameter. FIG. 14C depicts vertical NAND string 1401 after being dry etched to selectively remove the hardmask layer 1422 a portion of polysilicon 1421 from the channel. At 1304, the remainder of hardmask layer 1422 is removed using a well-known technique, and an oxide layer 1424 is deposited using a well-known technique so that etched region 1423 is filled. Depending on following processes, deposition of oxide layer 1424 can follow bitline patterning. FIG. 14D depicts vertical NAND string 1401 after the remainder of hard mask 1422 has been removed and oxide layer 1424 is deposited.

Figure 14E:
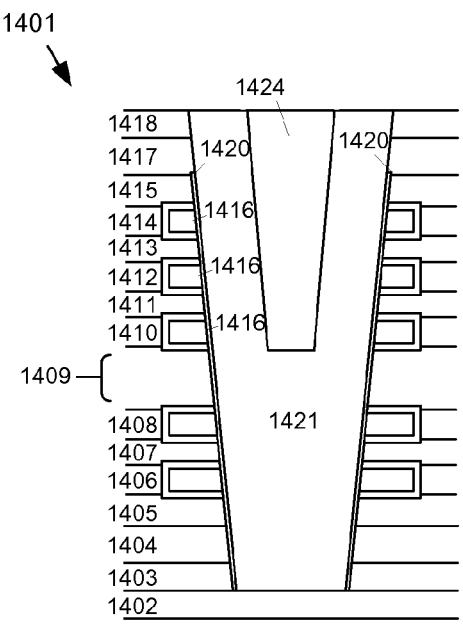
Figure 14F:
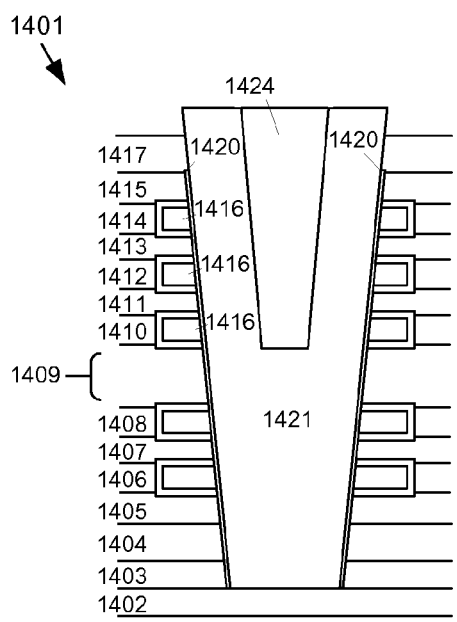

At 1305, oxide layer 1424 is removed down to silicon nitride stop layer 1418 using a well-known CMP technique. FIG. 14E depicts vertical NAND string 1401 after oxide layer 1424 is removed down to silicon nitride stop layer 1418. At 1306, silicon nitride stop layer 1418 is removed using a well-known wet-etch process. FIG. 14F depicts vertical NAND string 1401 after silicon nitride stop layer 1418 has been removed. Processing continues and the remainder of vertical NAND string 1401 is formed in a well-known manner, such as described in connection with FIG. 5.

Figure 15A:
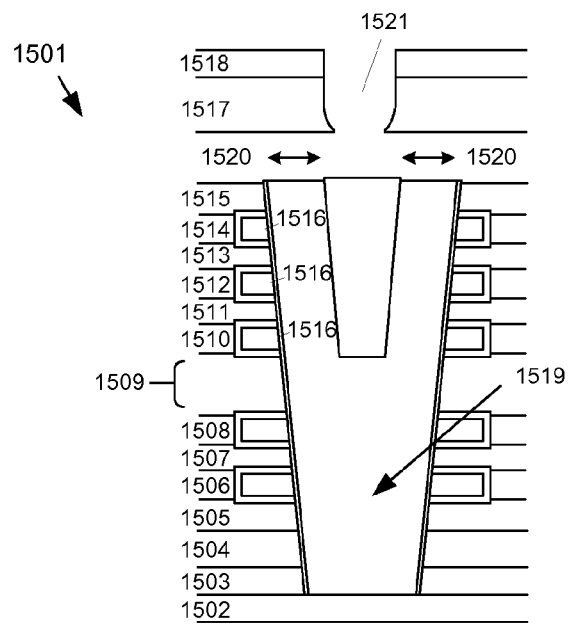
FIGS. 15A and 15B depict a vertical NAND string during fabrication of a polysilicon plug on a channel having a local channel dielectric according to the subject matter disclosed herein.

FIG. 15A depicts a vertical NAND string 1501 during fabrication. In particular, vertical NAND string 1501 has been formed in a well-known manner to comprise a source 1502, a first oxide layer 1503, an SGS layer 1504, a second oxide layer 1505, a first WL 1506, a third oxide layer 1507, a second WL layer 1508, an oxide separation region 1509 between dummy cells (above region 1509) and data cells (below region 1509), a third WL layer 1510, a fourth oxide layer 1511, a fourth WL layer 1512, a fifth oxide layer 1513, a fifth WL layer 1514, and a sixth oxide layer 1515. Additionally, a plurality of dummy and data flash cells 1516 have been formed, of which only a few are indicated. A high-aspect ratio channel trench 1519 has been formed in a well-known manner and a local channel dielectric has been formed in channel trench 1519 using any of the techniques disclosed herein.

Figure 15B:
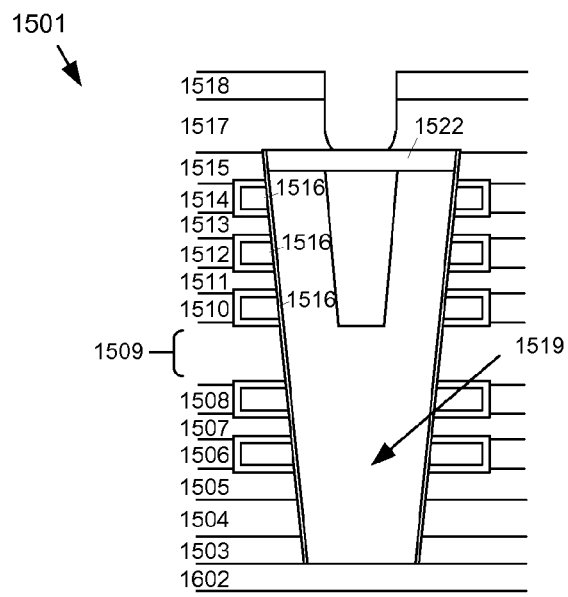

If the widths 1520 of the channel at the top edge of NAND string 1501 are less than about 20 nm, then there is a risk that when the rest of the channel 1521 is formed in SGD layer 1517 and oxide layer 1518, there will be a misalignment with the already-formed channel and the local channel dielectric. Consequently, to reduce this risk, embodiments of the subject matter disclosed herein provide a technique for forming a polysilicon plug 1522 that covers the top of the already-formed channel and local channel dielectric, thereby providing a better contact between both ends of the NAND channel. FIG. 15B depicts a polysilicon plug 1522 formed on the top of the already-formed channel and local channel dielectric according to embodiments of the subject matter disclosed herein.

In one exemplary embodiment, polysilicon plug 1522 is formed prior to removing the silicon nitride stop layer by, for example, etching in a well-known manner. Polysilicon plug 1522 can then be deposited using a well-known deposition technique, and shaped in a well-known manner prior to formation of the SGD and oxide layers.

Figure 16:
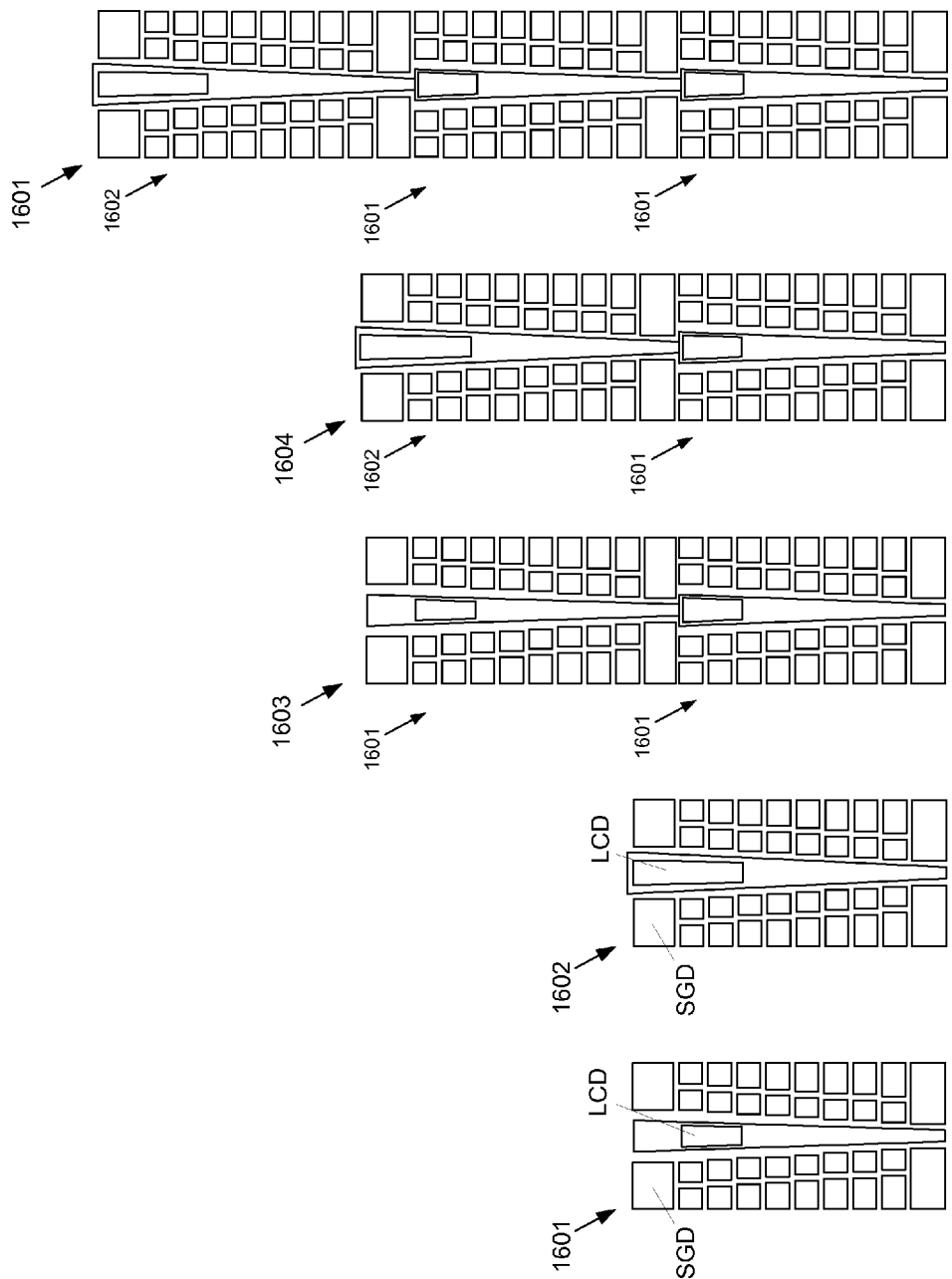
FIG. 16 depicts exemplary configurations of the vertical NAND strings that can be stacked to form stacked vertical NAND string arrays according to embodiments of the subject matter disclosed herein.

The subject matter disclosed herein can be extended to other scaling applications in which reduced thermionic field emission is utilized to achieve programming performance. One such application that lends itself well to the subject matter disclosed herein is at the stacked pillar interface when such an approach is used for string scaling in conjunction with pass gates at the stacked pillar junction. FIG. 16 depicts two exemplary configurations of the vertical NAND strings 1601 and 1602 that utilize a local channel dielectric according to the subject matter disclosed herein. Configuration 1601 comprises a local channel dielectric (LCD) that does not extend into the channel region adjacent to the select gate drain (SGD) of the string, whereas configuration 1602 comprises a LDC that does extend into the channel region adjacent to the SGD. The two configurations can be used for forming an array of NAND strings for, for example, a solid-state memory or a solid-state drive (SSD). Configuration 1603 depicts two stacked vertical NAND strings each comprising NAND string configuration 1601. Configuration 1604 depicts two stacked vertical NAND strings in which the lower NAND string comprises a configuration 1601 NAND string and the upper NAND string comprises a configuration 1602 NAND string. Configuration 1605 depicts three stacked vertical NAND strings in which the lower two NAND strings comprise configuration 1601 NAND strings and the upper NAND string comprises a configuration 1602 NAND string.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A memory device, comprising:
   multiple layers of memory cells in a vertical stack between a bitline and a source;
   a channel with a first region to conduct charge between the channel and the bitline, and a second region to conduct charge between the channel and the source, the channel to create an electric field at the memory cells;
   a select gate proximate the first region of the channel to selectively control conduction between the bitline and the channel;
   at least one dummy memory cell layer proximate the first region of the channel; and
   a dielectric to extend vertically through at least a portion of the channel, including an area proximate the first region of the channel near the select gate and the at least one dummy memory cell.

2. The memory device according to claim 1, wherein the memory device comprises part of an array of memory devices.

3. The memory device according to claim 1, wherein the channel includes a polysilicon material.

4. The memory device according to claim 1, wherein the memory cells comprise non-volatile memory cells.

5. The memory device according to claim 4, wherein the memory cells comprise a floating-gate (FG) memory cell.

6. The memory device according to claim 4, wherein the memory cells comprise a charge trap flash (CTF) memory cell.

7. The memory device according to claim 4, wherein the memory device comprises part of a solid-state drive (SSD).

8. The memory device according to claim 1, wherein the dielectric comprises an oxide material.

9. The memory device according to claim 1, wherein the dielectric spans only the portion of the channel.

10. The memory device according to claim 1, further comprising:
    at least one dummy memory cell layer proximate the second region of the channel.

11. The memory device according to claim 1, wherein the select gate proximate the first region of the channel comprises a first select gate, and further comprising:
    a second select gate proximate the second region of the channel, to selectively control conduction between the bitline and the source.

12. A solid state drive having a vertical memory array, comprising:
    a nonvolatile memory device including
       a vertical string of NAND memory cells, the string to extend between a bitline and a source;
       a channel having a first region to conduct charge between the channel and the bitline, and a second region to conduct charge between the channel and the source, the channel to provide an electric field to program the NAND memory cells;
       a select gate proximate the first region to selectively control conduction between the bitline and the channel;
       at least one dummy memory cell layer proximate the first region of the channel; and
       a dielectric to extend vertically through at least a portion of the channel, including an area proximate the first region of the channel near the select gate and the at least one dummy memory cell; and
    a controller to control access between the nonvolatile memory device and a host computer.

13. The solid state drive according to claim 12, wherein the memory device comprises part of an array of memory devices.

14. The solid state drive according to claim 12, wherein the channel includes a polysilicon material.

15. The solid state drive according to claim 12, wherein the NAND memory cells comprise a floating-gate (FG) memory cell.

16. The solid state drive according to claim 12, wherein the NAND memory cells comprise a charge trap flash (CTF) memory cell.

17. The solid state drive according to claim 12, wherein the dielectric comprises an oxide material.

18. The solid state drive according to claim 12, wherein the dielectric spans only the portion of the channel.

19. The solid state drive according to claim 12, the nonvolatile memory device further comprising:
- at least one dummy memory cell layer proximate the second region of the channel.

20. The solid state drive according to claim 12, wherein the select gate proximate the first region of the channel comprises a first select gate, and the nonvolatile memory device further comprising:
- a second select gate proximate the second region of the channel, to selectively control conduction between the bitline and the source.

* * * * *